US007998359B2

(12) United States Patent
Rogojina et al.

(10) Patent No.: US 7,998,359 B2
(45) Date of Patent: Aug. 16, 2011

(54) METHODS OF ETCHING SILICON-CONTAINING FILMS ON SILICON SUBSTRATES

(75) Inventors: Elena Rogojina, Los Altos, CA (US); Eric Rosenfeld, Sunnyvale, CA (US); Dmitry Poplavskyy, San Jose, CA (US)

(73) Assignee: Innovalight, Inc., Sunnyvale, CA (US)

( * ) Notice: Subject to any disclaimer, the term of this patent is extended or adjusted under 35 U.S.C. 154(b) by 0 days.

(21) Appl. No.: 12/889,958

(22) Filed: Sep. 24, 2010

(65) Prior Publication Data

US 2011/0028000 A1    Feb. 3, 2011

(51) Int. Cl.
*C03C 15/00* (2006.01)
(52) U.S. Cl. .......... 216/99; 216/106; 216/107; 438/753
(58) Field of Classification Search .................... 216/98, 216/99, 106, 107; 438/745, 753
See application file for complete search history.

(56) References Cited

U.S. PATENT DOCUMENTS

| 7,491,650 B2* | 2/2009 | Fucsko et al. | 438/745 |
|---|---|---|---|
| 2006/0043521 A1* | 3/2006 | Trivedi et al. | 257/499 |
| 2006/0148268 A1* | 7/2006 | Seo et al. | 438/758 |
| 2008/0179715 A1* | 7/2008 | Coppa | 257/647 |

* cited by examiner

*Primary Examiner* — Lan Vinh
(74) *Attorney, Agent, or Firm* — Foley & Lardner LLP

(57) ABSTRACT

A method for selectively etching a silicon-containing film on a silicon substrate is disclosed. The method includes depositing a silicon-containing film on the silicon substrate. The method further includes baking the silicon-containing film to create a densified silicon-containing film, wherein the densified film has a first thickness. The method also includes exposing the silicon substrate to an aqueous solution comprising $NH_4F$ and HF in a ratio of between about 6:1 and about 100:1, at a temperature of between about 20° C. and about 50° C., and for a time period of between about 30 seconds and about 5 minutes; wherein between about 55% and about 95% of the densified silicon-containing film is removed.

33 Claims, 5 Drawing Sheets

METHODS OF ETCHING SILICON-CONTAINING FILMS ON SILICON SUBSTRATES

FIELD OF DISCLOSURE

This disclosure relates in general to wet etching methods and in particular to methods of etching silicon-containing films on silicon substrates.

BACKGROUND

A thin film is generally a layer of material ranging from fractions of a nanometer to several microns in thickness. Crystalline silicon solar cells in particular may benefit from thin film construction. For example, a silicon-containing film may be used to enhance a dopant profile or to form a junction on a silicon substrate. More detail may found in U.S. patent application Ser. No. 12/656,710, entitled Methods Of Forming A Multi-Doped Junction With Silicon-Containing Particles filed on Feb. 12, 2010 and incorporated by reference.

In general, a densified silicon containing particle film, particularly a nanoparticle film, has substantially more surface area than the underlying substrate. Nanoparticles are generally microscopic particles with at least one dimension less than 100 nm. A silicon-containing nanoparticle film may have over 10,000 times the surface area of the underlying substrate.

Nanoparticles may be produced by a variety of techniques such as evaporation (S. Ijima, Jap. J Appl. Phys. 26, 357 (1987)), gas phase pyrolysis (K. A Littau, P. J. Szajowski, A. J. Muller, A. R. Kortan, L. E. Brus, J Phys. Chem. 97, 1224 (1993)), gas phase photolysis (J. M. Jasinski and F. K. LeGoues, Chem. Mater. 3, 989 (1991)), electrochemical etching (V. Petrova-Koch et al., Appl. Phys. Lett. 61, 943 (1992)), plasma decomposition of silanes and polysilanes (H. Takagi et al, Appl. Phys. Lett. 56, 2379 (1990)), high pressure liquid phase reduction-oxidation reaction (J. R. Heath, Science 258, 1131 (1992)), etc.

Etchants are often used to control the final thickness of a deposited silicon-containing film. For silicon-containing films (and for the underlying crystalline silicon substrates) etching generally involves breaking of atomic silicon bonds at defects in the crystal structure, such as at surface regions and grain boundaries (in the case of multi-crystalline solar cells).

However, because both the silicon-containing film and the underlying substrate contain silicon, common silicon etchant techniques such as KOH and fluorine-based etchants containing oxidizers are generally not selective and thus may also detrimentally etch the underlying substrate.

Fluorine-based etchants usually contain a source of fluoride ion F− to remove $SiO_2$ (hydrofluoric acid HF and/or its ammonium or sodium salts ($NH_4F$, NaF, $NaHF_2$)) and a strong oxidizer to convert Si into its oxide (nitric acid $HNO_3$, hydrogen peroxide $H_2O_2$, potassium permanganate $KMgO_4$, potassium chromate $K_2CrO_4$, iodine $I_2$, etc.). As a result of etching, roughness of surfaces increases, which may be desired for example, to increase light trapping in solar cells manufacturing. In addition, such etchants also tend to leave residual oxide due to the strong oxidizer presence, which may be problematic and may need to be removed with an additional process step, such as with diluted HF in order to achieve hydrogen-passivated hydrophobic surfaces needed for subsequent solar cell processing steps.

However, exclusion of oxidizer from the etching mixture prevents efficient etching of Si. For example, treatment of Si(111) surfaces with buffered $NH_4F$ not containing oxidizer, results in atomically flat H-passivated Si(111) surfaces without any substantial silicon etching (Christopher P. Wade and Christopher E. D. Chidsey: Appl. Phys. Lett. 71 (12), 22 Sep. 1997, pp. 1679-1681; and Sang-Eun Bae, Mi-Kyung Oh, Nam-Ki Min, Se-Hwan Paek, Suk-In Hong, and Chi-Woo J. Lee: Bull. Korean Chem. Soc. 2004, Vol. 25, No. 12, pp. 1822-1828).

In view of the foregoing, there is a desire to provide selective methods of etching silicon-containing films on silicon substrates without residual oxidation.

SUMMARY

The invention relates, in one embodiment, to a method for selectively etching a silicon-containing film on a silicon substrate. The method includes depositing a silicon-containing film on the silicon substrate. The method further includes baking the silicon-containing film to create a densified silicon-containing film, wherein the densified film has a first thickness. The method also includes exposing the silicon substrate to an aqueous solution comprising $NH_4F$ and HF in a ratio of between about 6:1 and about 100:1, at a temperature of between about 20° C. and about 50° C., and for a time period of between about 30 seconds and about 5 minutes; wherein between about 55 weight % and about 95 weight % of the densified silicon-containing film is removed.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, common silicon etchant techniques such as KOH and fluorine-based etchants containing oxidizers, are generally not selective and thus may also etch the underlying substrate. In addition, removal of the oxidizer will tend to retard the etching of silicon surfaces. In advantageous manner, a buffered HF (mixtures of ammonium fluoride $NH_4F$ and hydrofluoric acid HF) without an oxidizer may be used to selectively and controllably remove a silicon-containing nanoparticle film from the silicon substrate in a single step. For a deposited densified silicon-containing nanoparticle film (densified film), the use of such a buffered HF solution tends to increase the uniformity, particularly when covering textured silicon substrates, as well as allowing the formation of hydrogen-passivated hydrophobic surfaces. In one configuration, the densified film comprises over 50% silicon by weight. In one configuration, densified film has an average nanoparticle diameter of between about 30 nm to about 30 μm. In another configuration, the silicon-containing film is deposited on a substrate with one of an ink jet tool deposition tool, a screen-print deposition tool, and a spray-coating deposition tool.

Figure 1:
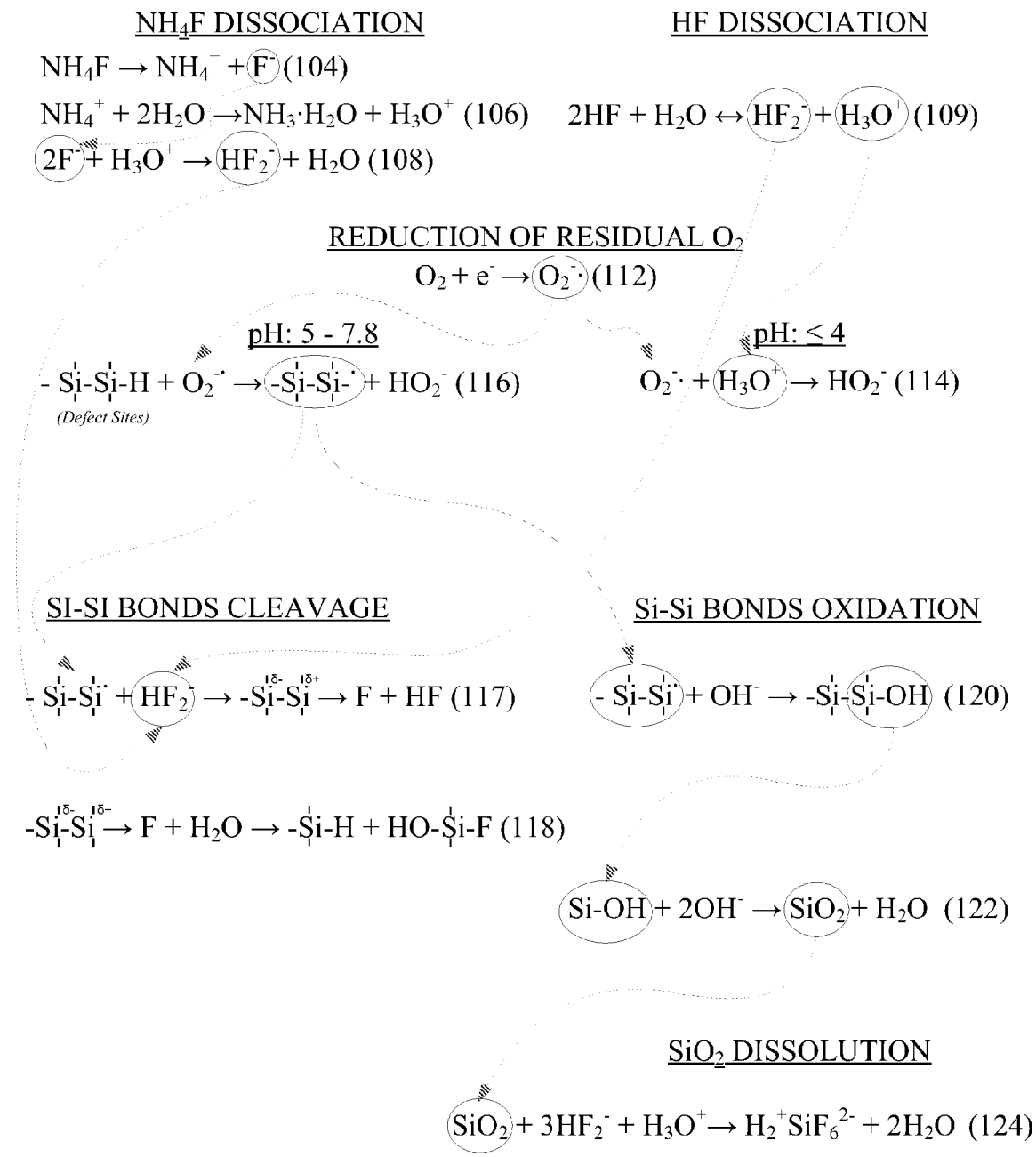
FIG. 1 shows a set of reactions for the etching of silicon-containing films with buffered solutions comprising $NH_4F$ and HF on silicon substrates, in accordance with the invention.

Referring now to FIG. 1, a set of reactions for the etching of silicon-containing films with buffered solutions comprising $NH_4F$ and HF on silicon substrates is presented, in accordance with the invention. In general, a buffered solution is an aqueous solution, consisting of a mixture of a weak acid and its conjugate base or a weak base and its conjugate acid, with a relatively constant pH level.

$NH_4F$ Dissociation: In aqueous solution, $NH_4F$ fully dissociates to a $NH_4^+$ cation and a F− anion (104). The generated $NH_4^+$ cation further tends to combine with $H_2O$ to form an $NH_3 \cdot H_2O$ complex and an $H_3O+$ cation (106). The $H_3O+$ cation, in turn, is available to react with the F− anion previously produced to form $H_2O$ and $HF_2^-$ (108), which in turn is subsequently consumed during Si—Si cleavage (117-118) and $SiO_2$ dissolution (124).

HF Dissociation: In aqueous solution, HF tends to dissociate to an $HF_2^-$ anion and an $H_3O^+$ cation (109) which is also available to form $HF_2^-$ (108), which in turn is also subsequently consumed during Si—Si cleavage (117-118)) and $SiO_2$ dissolution (124).

Reduction of Residual $O_2$: Ambient electrons in the aqueous solution, commonly generated from dangling silicon bonds in the deposited silicon-containing film and underlying Si substrate, interact with residual $O_2$ in order to form a superoxide anion radical $O_2^-$. (112). The superoxide anion radicals $O_2^-$. are further protonated with ambient protons in order to form $HO_2^-$. A source of protonation may depend on pH of the ambient solution. pH is generally the negative logarithm (base 10) of the molar concentration of dissolved hydronium ions ($H_3O^+$); a low pH indicates a high concentration of hydronium ions, while a high pH indicates a low concentration.

The etching reaction will either tend to proceed or tend to stall depending on the pH level in the aqueous solution. In accordance with the invention, pH level ranges between about 5 and 7.8 are optimal for the selective removal of Si-containing film from Si substrate.

pH Less Than 4.0 (ambient with high amount of acidic protons $H_3O^+$): At pH levels less than 4.0, $O_2^-$. anion radicals preferably subtract protons from $H_3O+$ formed during $NH_4F$ (106) and HF (109) dissociation, to create $HO_2^-$ (114). This reaction will not lead to any silicon etching.

pH Between 5.0 and 7.8 (ambient with low amount of acidic protons $H_3O^+$, or no protons present): $O_2^-$. anion radicals subtract protons from Si—H (hydrogen passivated silicon) at defect sites (terraces, dislocations) to form Si. radical and an $HO_2^-$ anion (116). Si. radicals then take part in two processes:

Si—Si Bonds Cleavage: The Si. radical is attacked by $HF_2^-$ anion to form polarized Si→F bonds (117), promoting further Si—Si bonds cleavage (Si etch) (118) with H-passivation of Si surface.

Si—Si Bonds oxidation: The Si. radical combines with ambient $OH^-$ anion to form Si—OH (120), which further condenses to form $SiO_2$ (122). $SiO_2$ then dissolves by reaction with an $HF_2-$ anion to form soluble complex $H_2^+SiF_6^{2-}$ and $H_2O$ (124).

Both reactions of Si. radical ether with $HF_2^-$ ((116) and (118)) or $OH^-$ anion ((120), (122) and (124)) result into Si removal.

It has to be noted that the mechanism described above is also responsible for etch-pit initiation by dissolved oxygen on terraces of H-passivated Si(111) surfaces (Christopher P. Wade and Christopher E. D. Chidsey; Appl. Phys. Lett. 71 (12), 22 Sep. 1997, pp. 1679-1681).

However, in case of Si(111) substrate surfaces no significant Si removal is observed, and atomically flat H-passivated Si surfaces were obtained after complete oxygen consumption. In contrast to Si substrate surfaces, in which no significant Si removal is observed, the inventors demonstrated effective material removal from Si-containing films deposited on Si substrates, under such non-oxidative treatment with aqueous $NH_4F$—HF mixture, as it will be shown below. The inventors further believe that such effective removal is a result of specific nature of deposited Si-containing films, providing abundance of defect sites, greatly increasing contribution of Si—H bonds oxidation at such sites with residual oxygen in a form of superoxide anion radical $O_2^-$. (214).

Experiment 1

Figure 2:
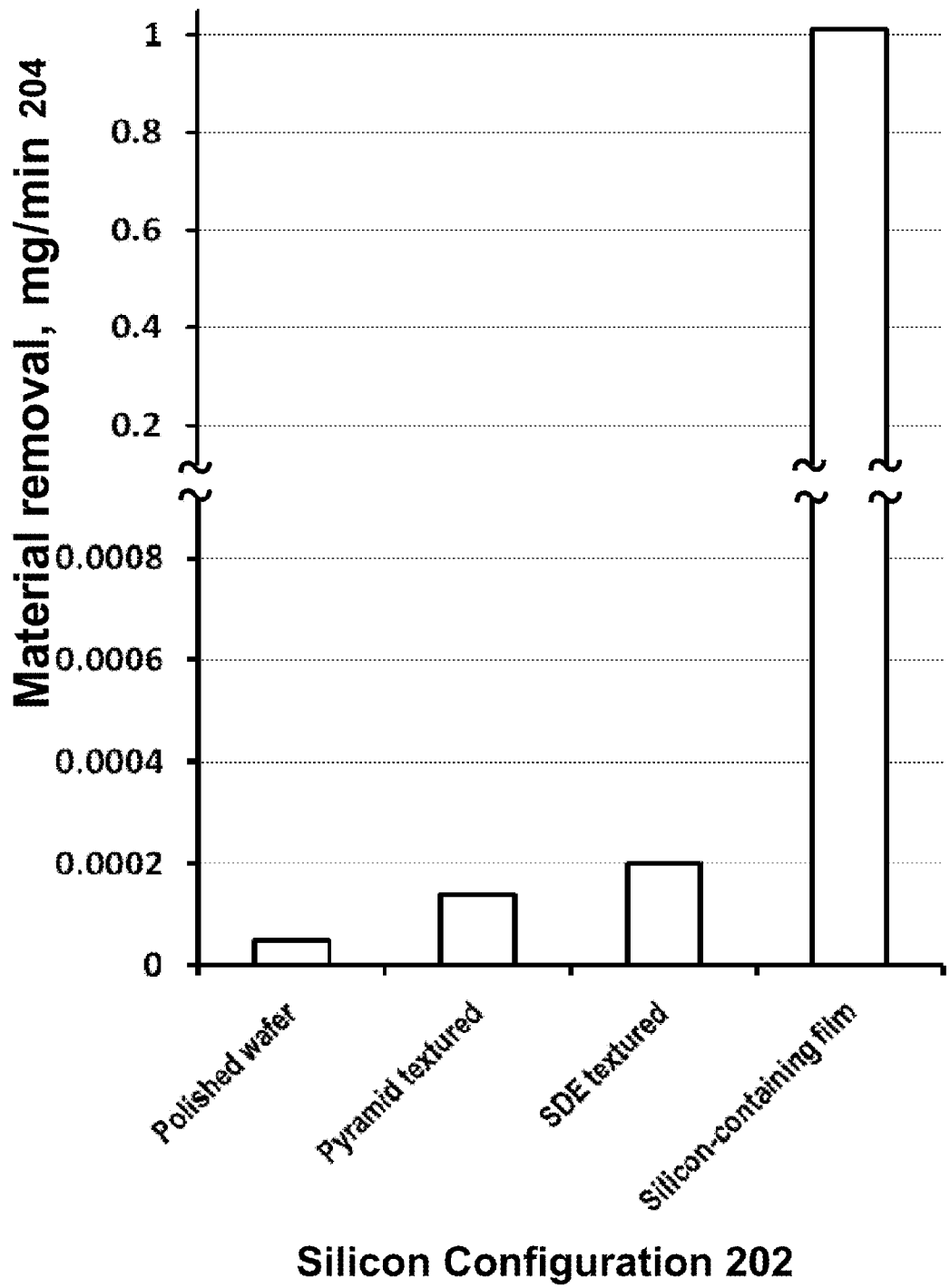
FIG. 2 shows the silicon removal rate of various substrate configurations, in accordance with the invention.

Referring to FIG. 2, the silicon removal rate 204 of various substrate configurations 202 is shown, in accordance with the invention. Inventors have prepared four substrates with different relative concentration of silicon defect sites susceptible to Si—Si bonds cleavage and oxidation: a polished silicon substrate (smallest possible surface area and defect free (100) surface), a random pyramid textured (RPD) silicon substrate (mostly (111) surface with a higher surface area), a saw damage etched (SDE) substrate (a continuous transition between different crystallographic orientations therefore likely more surface defects), an RPD substrate with a densified Si-containing film (substantially more surface area than the substrate), deposited on the substrate.

The polished silicon substrate was a 100 mm circular (100) wafer with both sides mirror polished. The substrate was cleaned in diluted HF solution prior to the experiment to ensure clean oxide-free surface.

The SDE substrate was prepared by etching 156 mm pseudo-square (100) as-cut silicon wafers in an HF—$HNO_3$ mixture at 10° C. for 3 min, followed by a two step final clean utilizing a dilute KOH solution and finally a dilute SC1 (a mixture of de-ionized water, hydrogen peroxide and ammonium hydroxide) solution.

The random-pyramid (RPD) textured substrate was prepared by etching saw-damage-etched 156 mm pseudo-square (100) silicon wafers in an alkaline texturing bath, followed by final cleaning in a diluted HF—HCl solution. The random sized pyramids on the surface of the wafers had a base size that ranged from 2 um to 10 um across. The average pyramid base size was around 7 um across.

The substrate with the densified Si-containing film was prepared by screen printing silicon nanoparticle ink pattern on top of a random-pyramid-textured 156 mm pseudo-square silicon wafer (preparation described above). The ink was subsequently dried in a quartz tube furnace at a temperature of 550° C. for 12 min in a $N_2:O_2$ ambient ($N_2:O_2$=4:1). The silicon substrate was weighed prior to ink deposition and after ink drying to measure a net weight of the dry printed film.

All substrates were first weighed and then divided up into three batches. Each batch was then treated with a 25:1 $NH_4F$—HF solution at 30° C. for different process times of 1, 2, and 3 minutes. Processing the wafers in each batch was followed by a 5 min rinse in a quick-dump-rinse (QDR) bath and then drying in a spin-rinse-dryer (SRD), after which the wafers were re-weighed to determine the amount of Si film removed during the process. As it is clear from FIG. 2, silicon removal rate increases by about four times when the wafer surface is changed from polished (with negligible amount of defect sites) to saw-damage-etched; moreover the removal rate increases by about 5000 times for the RPD substrate with a Si-containing film, when compared to the bare RPD substrate.

Experiment 2

Figure 3B:
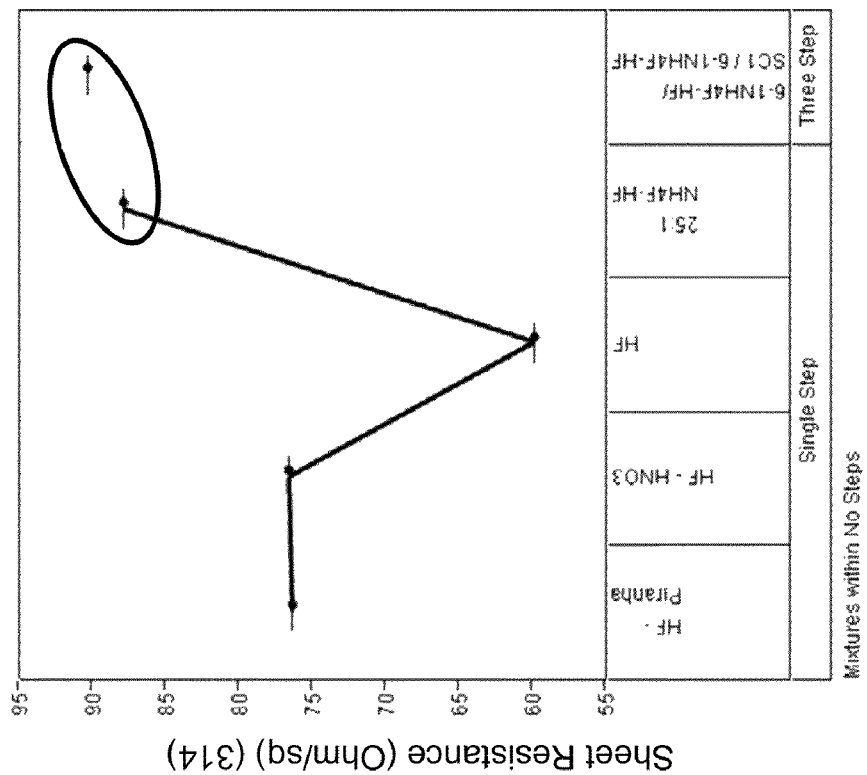
FIGS. 3A-B show a set of diagrams comparing a three-step silicon etching ammonium hydroxide-based process to a fluoride-based single-step etching processes with and without oxidizers, in accordance with the invention.
Figure 3A:
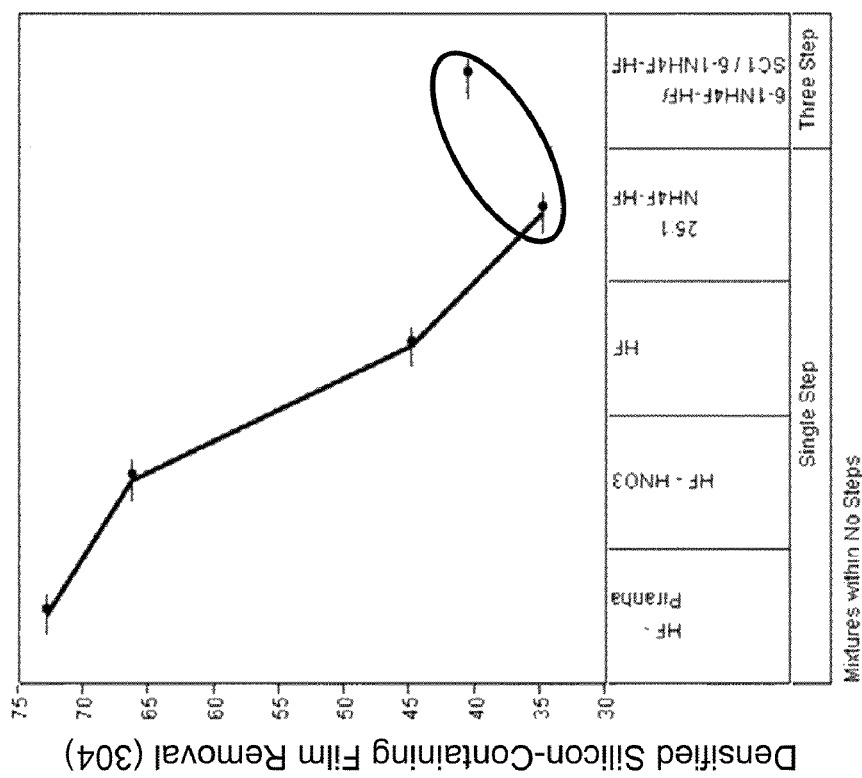

Referring now to FIGS. 3A-B, a set of diagrams comparing a three-step silicon etching ammonium hydroxide-based process to a fluoride-based single-step etching processes with and without oxidizers, in accordance with the invention. The ammonium hydroxide-based process is represented by the sequence of three etch steps: room temperature buffered oxide etchant (BOE, $NH_4F$:HF=6:1), followed by a room temperature dilute oxidizing SC1 mixture ($H_2O$:$H_2O_2$:$NH_4OH$=100:1:1), then followed again by an room temperature BOE oxide removal step. The single step etching process is represented by several different processes, which include dilute HF, buffered oxide etchant (25:1 ratio at 30° C.), and mixtures of HF and different oxidizers such as nitric acid ($HNO_3$), and Piranha (mixture of hydrogen peroxide and sulfuric acid). FIG. 3A shows the weight percentage of printed film removal (with respect to the starting dry film weight), whereas FIG. 3B shows the resulting measured sheet resistance as result of enhanced phosphorous doping in the ink printed regions.

The removal rates in aqueous solutions of HF were compared for etching of conventional mono-crystalline silicon and densified silicon-containing films. Removal of the densified silicon-containing films in single step treatment with HF, HF—$HNO_3$ mixture, HF-Piranha mixture and buffered HF ($NH_4F$—HF) and 3-step process $NH_4F$—HF/SC1/$NH_4F$—HF was also compared, in accordance with the invention. The Si-containing film samples were prepared as follows.

A set of 156 mm pseudo-square 200 um thick p-type mono-crystalline silicon wafers were first etched in an alkaline solution to provide a random pyramid textured surface. Subsequently, after additional cleaning with HF, Si-containing films were deposited on the wafers by screen printing of silicon ink. The films were subsequently dried in a quartz tube furnace at a temperature of 550° C. for 12 min in an ambient of nitrogen and oxygen ($N_2$:$O_2$=4:1).

After drying, different samples were subjected to different types of wet cleaning, all performed in a chemical bath, followed by a 5 min rinse in a quick-dump-rinse (QDR) bath and then drying in a spin-rinse-dryer (SRD). Wet chemical processes used in the experiment include aqueous hydrofluoric (HF) acid with 7% concentration of HF, mixtures of HF and $HNO_3$ (15% HF—9% $HNO_3$ at 35° C. and for 3 minutes), mixtures of HF and Piranha ($H_2O_2$ and $H_2SO_4$) (20% HF—23% Piranha at 30° C. and for 3 minutes), a buffered HF (mixture of $NH_4F$:HF=25:1 at 30° C. and for 1.5 minutes), as well as 6:1 BOE (buffered oxide etchant) and SC1 (1 part 34% ammonium hydroxide, 1 part 30% hydrogen peroxide, 100 parts Di-Water) for 3-step treatment. FIG. 3A reflects material removal (% of the original dry deposit) for all treatments tested.

For samples exposed to aqueous HF, the mono-crystalline silicon removal rate was effectively 0.0, while for the sintered silicon-containing film, the removal rate was greater than 2000 Å/minute. It is believed that such a high removal rate of the printed film, when using HF, is a result of partial inevitable oxidation of the printed porous film (which happens through the film thickness) during deposition and drying, whereby HF attacks oxidized parts of the porous film thus resulting in a high material removal rate. The material removal tends to cease at long enough process times indicating complete dissolution of silicon dioxide in the film (as previously shown at 124 in FIG. 1).

Further film removal can be achieved by adding an oxidative agent to HF thus providing a mixture where simultaneous processes of Si oxidation and Si oxide dissolution take place. This constitutes a well known approach to etching silicon with the examples of HF—$HNO_3$ and HF-Piranha, tested in this experiment. While such oxidation-based approaches can provide effective and tunable ink removal, they may leave the deposited silicon-containing film partially oxidized, which tends to attenuate doping strength in the selective emitter process where printed ink is used to enhance dopant diffusion. This is further described in U.S. Pat. No. 7,615,393, entitled Methods of Forming Dual-Doped Junctions on a Substrate and filed Oct. 29, 2008, and U.S. patent application Ser. No. 12/506,811, entitled Methods of Using a Silicon Nanoparticle Ink To Control In Situ A Phosphorous Diffusion Profile and filed Jul. 21, 2009, both of which are incorporated by reference.

As result of residual oxide in the silicon containing films, the sheet resistance of the doped region resulting from the printed silicon film tends to be higher, indicating weakened dopant diffusion in the case of etching processes with simultaneous oxidation and oxide removal, see HF—$HNO_3$ and HF-Piranha in FIG. 3B. Furthermore, such approaches tend to result in non-uniform etching of printed films.

It has been found that a three step process $NH_4F$—HF/SC1/$NH_4F$—HF results in effective and tunable removal of printed film yielding hydrogen-passivated-residual printed film. The first step consists of a treatment of the sintered silicon-containing film with BOE to remove Si oxide. The second step consists of oxidizing the freshly exposed H-passivated Si surface with SC1 solution. The final step consists of treating the silicon-containing film again with BOE to remove oxide and regain H-passivation of the surface. Each step is followed by a 5 minute rinse in a quick-dump-rinse (QDR) bath and the final rinse is then followed by drying in a spin-rinse-dryer (SRD). The three-step process provides significant material removal with final H-passivation of the surface, which is required to achieve enhanced doping (low sheet resistance) in the ink printed region (FIG. 3B). However, the total processing time of the three-step treatment is significant (25 minutes) and requires three chemical baths.

Inventors believe that, in an advantageous manner, a simpler tunable single step ink removal can be achieved by using non-oxidative buffered HF approach ($NH_4F$—HF) over longer, three-step $NH_4F$—HF/SC1/$NH_4F$—HF approach; as well as single step oxidative methods involving mixtures of oxidizing agents (such as e.g. $HNO_3$, Piranha) and aqueous HF, comparable in processing time but resulting in partially oxidized surface. The results presented in FIG. 3A-B for the $NH_4F$—HF process clearly illustrate that strong ink removal and low sheet resistance (i.e. strong doping) can be achieved with this non-oxidative method. Such short single-step procedure can be implemented, for example, for high throughput in-line processes.

Experiment 3

Figure 4B:
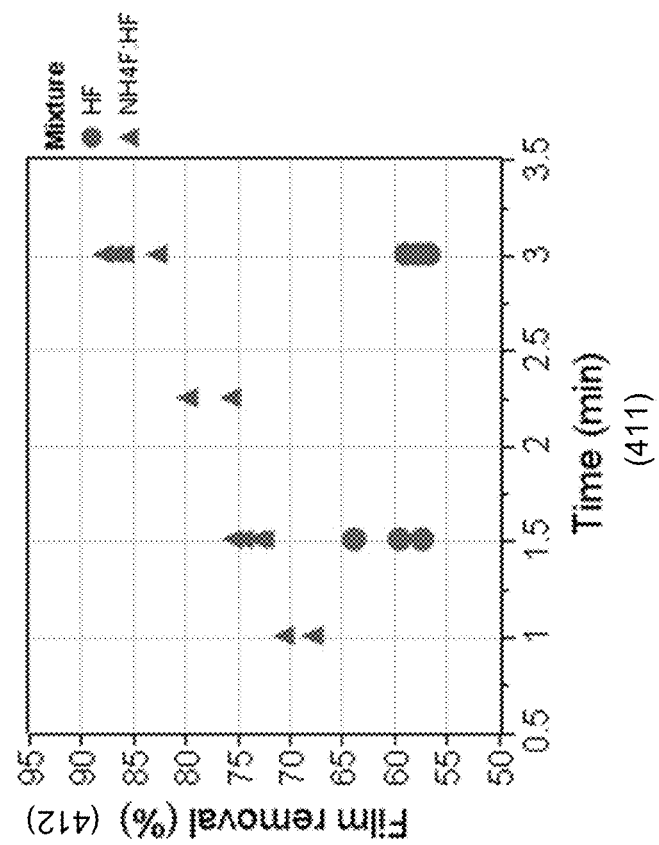
FIGS. 4A-B show process tunability by using process temperature and process time, in accordance with the invention; and, FIG. 5 shows average ink removal as function of the pH level of the etching mixture, in accordance with the invention.
Figure 4A:
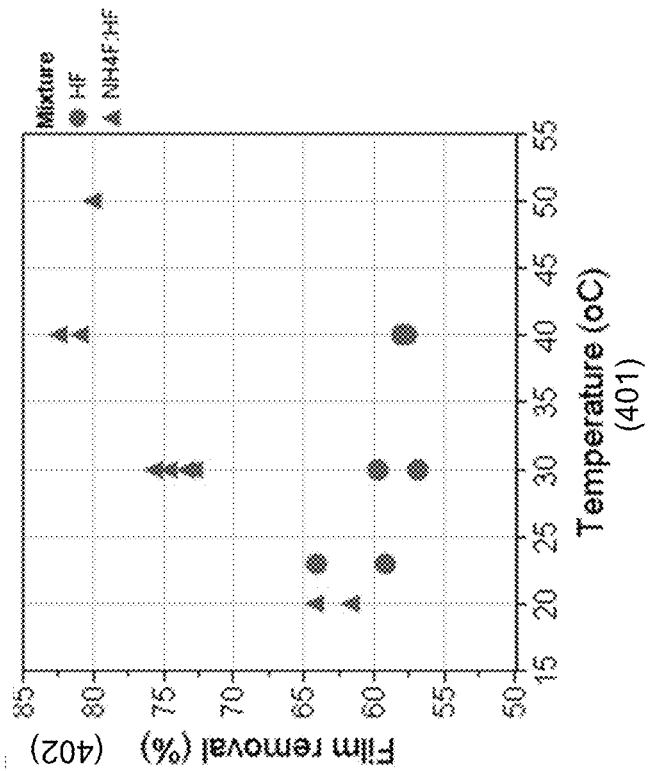

Referring now to FIGS. 4A-B, a set of diagrams showing silicon-containing film removal with aqueous solutions of non-buffered HF and buffered HF ($NH_4F$:HF) as a function of temperature and time respectively are shown, in accordance with the invention. FIG. 4A shows (silicon-containing) Film Removal Percentage (%) 402 as a function of temperature (° C.) 401, while FIG. 4B shows (silicon-containing) Film Removal percentage (%) 412 as a function of time (minutes) 411.

Four sets of 156 mm pseudo-square 200 um thick p-type mono-crystalline silicon wafers were first etched in an alkaline solution to provide a random pyramid textured surface. Subsequently, after additional cleaning with HF, Si-containing films were deposited on the wafers by screen printing of silicon ink. The films were subsequently dried in a quartz tube furnace at a temperature of 550° C. for 12 min in an ambient of nitrogen and oxygen ($N_2$:$O_2$=4:1).

Referring to FIG. 4A, the first and second subsets of the processed wafers were exposed to aqueous non-buffered HF ($H_2O$:HF=6:1) and buffered HF solution ($NH_4F$:HF=25:1), respectively, from a temperature of about 20° C. to about 50° C. As can be seen in the figure, as temperature is increased, the film removal percentage tends to remain constant between about 56% and about 60% for HF exposure (pH=3.5), while it tends to increase from about 62% to about 83% for $NH_4F$:HF (pH=6.3). The inventors believe that as the temperature increases, a greater number of Si radicals is created in the $NH_4F$:HF solution by Si—H bonds interaction with the $O_2^-$. anion radicals (116), which in turn enables increased Si—Si Bond Cleavage (118) and Si—Si Bond Oxidation (120), as shown in FIG. 1, resulting in a greater film removal at higher temperature.

Referring to FIG. 4B, a third and fourth subset of the processed wafers were exposed to aqueous HF ($H_2O$:HF=6:1) and buffered HF solution ($NH_4F$:HF=25:1) respectively at a temperature of 30° C., and for an exposure time period of about 1 minutes to about 3 minutes. As can be seen in the figure, as the time period is increased, the film removal percentage tends to remain constant between about 56% and about 60% for the HF exposure (pH=3.3), while it tends to increase from about 68% to about 87% for $NH_4F$:HF (pH=6.3). As before, the inventors believe that as time increases, a greater number of Si radicals is created in the $NH_4F$:HF solution by Si—H bonds interaction with the $O_2^-$. anion radicals (116), which in turn enables increased Si—Si Bond Cleavage (118) and Si—Si Bond Oxidation (120), as shown in FIG. 1, resulting in greater film removal at longer exposure time.

Experiment 4

Figure 5:
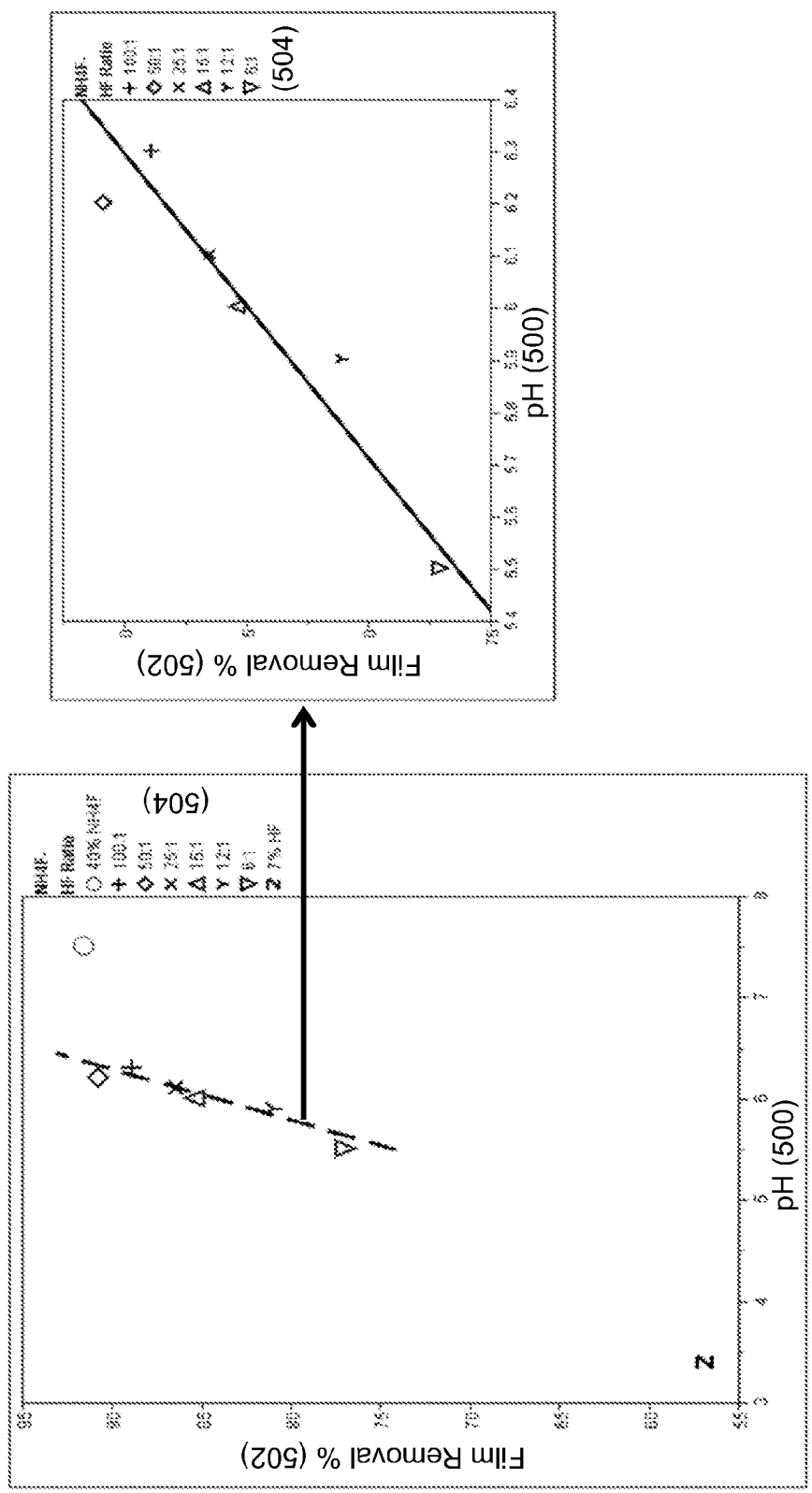

Referring now to FIG. 5, a simplified diagram showing the effects of pH for various $NH_4F$—HF mixtures, in accordance with the invention. Specific $NH_4F$—HF mixture ratios (504) tend to correspond to specific pH levels (500).

A set of 156 mm pseudo-square 200 um thick p-type mono-crystalline silicon wafers were first etched in an alkaline solution to provide a random pyramid textured surface. Subsequently, after additional cleaning with HF, Si-containing films were deposited on the wafers by screen printing of silicon ink. The films were subsequently dried in a quartz tube furnace at a temperature of 550° C. for 12 min in an ambient of nitrogen and oxygen ($N_2$:$O_2$=4:1). The substrates where then exposed to $NH_4F$—HF mixture ratios (504) with a range of $NH_4F$:HF ratios at a temperature of about 30° C. In general, as the $NH_4F$—HF ratios (504) mixture ratio is increased from about 0:100 (pH about 3.3) to about 100:0 (pH about 7.8), the corresponding film removal % (502) tends to increase at a decreasing (asymptotic) rate from about 56% to about 92%. However, from about 6:1 (pH about 5.5) to about 100:1 (pH about 6.3), the corresponding film removal % (502) tends to increase at a linear rate from about 75% to about 92%.

As can be seen, between about 55% and about 95% of a silicon-containing film of between about 30 μm and about 3 nm, may be removed in a $NH_4F$:HF mixture of the ratio preferably between about 6:1 and about 100:1, at a temperature of between about 20° C. and about 50° C., and for a time period of between about 30 seconds and about 5 minutes.

Between about 55% and about 95% of the silicon-containing film may more preferably be removed in a $NH_4F$:HF mixture of between about 25:1 and about 100:1, at a temperature of between about 20° C. and about 40° C., and for a time period of between about 30 seconds and about 3 minutes.

Between about 55% and about 95% of the silicon-containing film may most preferably be removed in a $NH_4F$:HF mixture of about 25:1 at a temperature of between about 25° C. and about 35° C., and for a time period of between about 30 seconds and about 3 minutes.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention. For example, the silicon-containing particles may be intrinsic or doped.

Advantages of the invention include the selective removal of a silicon-containing film on a silicon substrate in a single step without the generation of residual oxide.

Having disclosed exemplary embodiments and the best mode, modifications and variations may be made to the disclosed embodiments while remaining within the subject and spirit of the invention as defined by the following claims.

What is claimed is:

1. A method for selectively etching a densified film on a silicon substrate comprising:
   depositing a silicon-containing film on a silicon substrate with a deposition tool;
   baking the silicon-containing film at a baking temperature and for a baking time period to create a densified film, wherein the densified film has a first thickness;
   exposing the silicon substrate to an aqueous solution comprising $NH_4F$ and HF in a ratio of between about 6:1 and about 100:1, at a temperature of between about 20° C. and about 50° C., and for a time period of between about 30 seconds and about 5 minutes;
   wherein between about 55% and about 95% of the densified film is removed and wherein the baking temperature is between about 100° C. and about 550° C.

2. The method of claim 1, wherein the $NH_4F$ and HF ratio is between about 25:1 and about 100:1, at a temperature of between about 20° C. and about 40° C., and for a time period of between about 30 seconds and about 3 minutes.

3. The method of claim 1, wherein the $NH_4F$ and HF ratio is about 25:1 at a temperature of between about 25° C. and about 35° C., and for a time period of between about 30 seconds and about 3 minutes.

4. The method of claim 1, further including the step of texturing the silicon substrate with a texturing process.

5. The method of claim 4, wherein the texturing process is one of acidic texturing and alkaline texturing.

6. The method of claim 1, wherein the substrate is one of a random pyramid textured substrate and a smooth textured substrate.

7. The method of claim 1, wherein the baking time period is between about 30 seconds and about 12 minutes.

8. The method of claim 1, wherein the densified film has a film thickness of between about 30 nm to about 30 µm.

9. The method of claim 1, wherein the densified film contains more than about 50% silicon by weight.

10. The method of claim 1, wherein the densified film comprises a set of silicon-containing nanoparticles.

11. The method of claim 10, wherein an average diameter of each of the set of silicon-containing nanoparticles is between about 2 nm and about 30 nm.

12. The method of claim 1, wherein the deposition tool is one of an ink-jet deposition tool, a screen-print deposition tool, and a spray-coating deposition tool.

13. A method for selectively etching a densified film on a silicon substrate comprising:
    depositing a silicon-containing film on a silicon substrate with a deposition tool;
    baking the silicon-containing film at a baking temperature and for a baking time period to create a densified film, wherein the densified film has a first thickness;
    exposing the silicon substrate to an aqueous solution comprising $NH_4F$ and HF in a ratio of between about 6:1 and about 100:1, at a temperature of between about 20° C. and about 50° C., and for a time period of between about 30 seconds and about 5 minutes;
    wherein between about 55% and about 95% of the densified film is removed and wherein the baking time period is between about 30 seconds and about 12 minutes.

14. The method of claim 13, wherein the $NH_4F$ and HF ratio is between about 25:1 and about 100:1, at a temperature of between about 20° C. and about 40° C., and for a time period of between about 30 seconds and about 3 minutes.

15. The method of claim 13, wherein the $NH_4F$ and HF ratio is about 25:1 at a temperature of between about 25° C. and about 35° C., and for a time period of between about 30 seconds and about 3 minutes.

16. The method of claim 13, further including the step of texturing the silicon substrate with a texturing process.

17. The method of claim 16, wherein the texturing process is one of acidic texturing and alkaline texturing.

18. The method of claim 13, wherein the substrate is one of a random pyramid textured substrate and a smooth textured substrate.

19. The method of claim 13, wherein the densified film has a film thickness of between about 30 nm to about 30 µm.

20. The method of claim 13, wherein the densified film contains more than about 50% silicon by weight.

21. The method of claim 13, wherein the densified film comprises a set of silicon-containing nanoparticles.

22. The method of claim 21, wherein an average diameter of each of the set of silicon-containing nanoparticles is between about 2 nm and about 30 nm.

23. The method of claim 13, wherein the deposition tool is one of an ink jet deposition tool, a screen-print deposition tool, and a spray-coating deposition tool.

24. A method for selectively etching a densified film on a silicon substrate comprising:
    depositing a silicon-containing film on a silicon substrate with a deposition tool;
    baking the silicon-containing film at a baking temperature and for a baking time period to create a densified film, wherein the densified film has a first thickness;
    exposing the silicon substrate to an aqueous solution comprising $NH_4F$ and HF in a ratio of between about 6:1 and about 100:1, at a temperature of between about 20° C. and about 50° C., and for a time period of between about 30 seconds and about 5 minutes;
    wherein between about 55% and about 95% of the densified film is removed and wherein the densified film comprises a set of silicon-containing nanoparticles.

25. The method of claim 24, wherein the $NH_4F$ and HF ratio is between about 25:1 and about 100:1, at a temperature of between about 20° C. and about 40° C., and for a time period of between about 30 seconds and about 3 minutes.

26. The method of claim 24, wherein the $NH_4F$ and HF ratio is about 25:1 at a temperature of between about 25° C. and about 35° C., and for a time period of between about 30 seconds and about 3 minutes.

27. The method of claim 24, further including the step of texturing the silicon substrate with a texturing process.

28. The method of claim 27, wherein the texturing process is one of acidic texturing and alkaline texturing.

29. The method of claim 24, wherein the substrate is one of a random pyramid textured substrate and a smooth textured substrate.

30. The method of claim 24, wherein the densified film has a film thickness of between about 30 nm to about 30 µm.

31. The method of claim 24, wherein the densified film contains more than about 50% silicon by weight.

32. The method of claim 24, wherein an average diameter of each of the set of silicon-containing nanoparticles is between about 2 nm and about 30 nm.

33. The method of claim 24, wherein the deposition tool is one of an ink-jet deposition tool, a screen-print deposition tool, and a spray-coating deposition tool.

* * * * *